United States Patent
He et al.

(10) Patent No.: US 9,214,948 B2
(45) Date of Patent: Dec. 15, 2015

(54) COMPARATOR TRACKING CONTROL SCHEME WITH DYNAMIC WINDOW LENGTH

(71) Applicant: Cirrus Logic, Inc., Austin, TX (US)

(72) Inventors: Ku He, Austin, TX (US); Xin Zhao, Austin, TX (US); Xiaofan Fei, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/255,912

(22) Filed: Apr. 17, 2014

(65) Prior Publication Data

US 2015/0303932 A1    Oct. 22, 2015

(51) Int. Cl.
*H03M 1/12*    (2006.01)
*H03M 1/00*    (2006.01)
*H03M 1/36*    (2006.01)

(52) U.S. Cl.
CPC ............. *H03M 1/002* (2013.01); *H03M 1/36* (2013.01)

(58) Field of Classification Search
CPC ..... H03M 7/3086; H03M 1/002; H03M 1/12; H03M 1/361; H03M 1/365; H03M 1/183; H03M 1/208; H03M 1/182
USPC .......... 341/118–121, 139, 140, 155, 158, 159
See application file for complete search history.

(56) References Cited

U.S. PATENT DOCUMENTS

| | | | |
|---|---|---|---|
| 5,296,856 A * | 3/1994 | Mantong | 341/139 |
| 5,608,399 A | 3/1997 | Coleman, Jr. | |
| 6,181,268 B1 | 1/2001 | Miyake et al. | |
| 6,188,347 B1 | 2/2001 | Knudsen | |
| 6,404,372 B1 * | 6/2002 | Heithoff | 341/155 |
| 6,809,676 B1 | 10/2004 | Younis et al. | |
| 7,405,688 B2 * | 7/2008 | Prestros | 341/155 |
| 7,417,576 B2 * | 8/2008 | Prestros | 341/164 |
| 7,656,339 B2 * | 2/2010 | Chmelar | 341/159 |
| 7,696,915 B2 * | 4/2010 | Chmelar et al. | 341/159 |
| 7,973,692 B2 * | 7/2011 | Chmelar et al. | 341/159 |
| 2008/0122426 A1 * | 5/2008 | Prestros | 324/76.12 |
| 2008/0272944 A1 * | 11/2008 | Zhou et al. | 341/143 |
| 2010/0079322 A1 * | 4/2010 | Gladshtein et al. | 341/142 |
| 2010/0117880 A1 | 5/2010 | Moore et al. | |
| 2011/0298641 A1 | 12/2011 | Khanpour et al. | |
| 2012/0139764 A1 | 6/2012 | Sosio et al. | |
| 2012/0268299 A1 * | 10/2012 | Kidambi | 341/155 |
| 2015/0002326 A1 * | 1/2015 | Farley et al. | 341/155 |

* cited by examiner

*Primary Examiner* — Linh Nguyen

(74) *Attorney, Agent, or Firm* — Norton Rose Fulbright US LLP

(57) ABSTRACT

A comparator tracking scheme for an analog-to-digital converter (ADC) may implement a dynamic window size by varying, over time, a number of comparators powered up to convert an analog input signal to a digital output signal. A comparator-tracking scheme may be implemented, for example, in a controller coupled to a plurality of comparators in an ADC. For example, the controller may determine a window size for the ADC and determine a window position for the ADC. The controller may then activate comparators of the ADC within a window centered at the window position and having a width of the window size. The controller may determine a window size by analyzing an output of a filter. When the filter output indicates a rapidly changing analog input signal, the controller may dynamically increase a window size of the ADC, which may increase a number of comparators powered on.

21 Claims, 9 Drawing Sheets

COMPARATOR TRACKING CONTROL SCHEME WITH DYNAMIC WINDOW LENGTH

FIELD OF THE DISCLOSURE

The instant disclosure relates to electronic circuits. More specifically, this disclosure relates to analog-to-digital converters (ADC).

BACKGROUND

Analog-to-digital converters (ADCs) convert analog signals to discrete digital signals for processing by digital electronics. For example, an ADC may be used to convert an analog audio input from a microphone to a digital signal for processing and manipulation by a digital processor, such as a microprocessor or a digital signal processor (DSP). One example of a conventional ADC is shown in FIG. 1.

An ADC 100 may receive an input signal, $V_{in}$, for conversion to a digital signal. The input signal, $V_{in}$, may range, for example, between 0 and 5 Volts. The ADC may convert the input signal, $V_{in}$, to a digital output signal, OUT, through a plurality of comparators 102A-N. The digital output signal, OUT, may have N bits corresponding to the number of comparators 102A-N. Each of the comparators 102A-N compare the input signal, $V_{in}$, to a reference level that is a fraction of a reference input, $V_{ref}$, defined by resistors 104A-N. For example, when the input signal, $V_{in}$, ranges from 0 to 5 Volts, and there are four comparators, the comparator 102A may compare the input voltage, $V_{in}$, to 3.75 Volts, the comparator 102B may compare the input signal, $V_{in}$, to 2.5 Volts, the comparator 102C may compare the input signal, $V_{in}$, to 1.25 Volts, and the comparator 102N may compare the input signal, $V_{in}$, to 0 Volts. Each of the comparators 102A-N may output a zero value if the input signal, $V_{in}$, is not higher than 3.75, 2.5, 1.25, and 0 Volts, respectively. Likewise, each of the comparators 102A-N may output a one value if the input signal, $V_{in}$, is higher than 3.75, 2.5, 1.25, and 0 Volts, respectively. Thus, when the input signal, $V_{in}$, is 3.0 Volts, the output digital signal, OUT, would be "0111." Accuracy may be improved in the ADC 100 by, for example, increasing the number of comparators 102A-N.

In the example provided above, each of the comparators 102A-N is continuously comparing the input signal, $V_{in}$, to a reference level. Thus, each of the comparators 102A-N is consuming power, despite the fact that the outputs of some of the comparators 102A-N may rarely change. In the example described above, the input signal, $V_{in}$, may range between 0 and 5 Volts, but generally remains around 2.5-3.0 Volts. For such a signal, the comparators 102A and 102B may be sufficient for part of the time to generate the digital output signal, OUT, and the comparators 102C and 102D may be powered down.

Conventional tracking ADCs are one type of ADC that focuses on conversion of a small sampling region. A tracking ADC may activate comparators around a region of interest and power down other comparators of the comparators 102A-N to reduce power consumption by the ADC 100. For example, in a flash type of tracking ADC, only comparators with a reference level close to a voltage level of the input signal, $V_{in}$, may be turned on during normal operation. A control signal, CTRL, may be used to turn on and turn off the comparators 102A-N in this type of ADC.

Conventional tracking ADCs may also, for example, shuffle sensing components of the ADC or manipulate the input signal, $V_{in}$, to adapt the tracking range of the ADC to improve tracking accuracy or resolution. For example, shuffling sensing components of the ADC may include implementing a window tracking feature, which turns on a set number of the comparators 102A-N, such as four comparators, and then shifts which four comparators are powered on based on a level of the input signal, $V_{in}$. In another example, adapting the tracking range of the ADC may include changing the reference level of the comparators 102A-N, such as by varying a resistance of the resistors 104A-N. However, both of these conventional tracking ADCs have fixed numbers of active comparators of the comparators 104A-N. This reduces the flexibility of the ADC to respond to a rapidly changing input signal, $V_{in}$, while also placing a limit of the power savings potential of the tracking ADC.

Shortcomings mentioned here are only representative and are included simply to highlight that a need exists for improved analog-to-digital converters (ADCs), particularly for consumer-level devices. Embodiments described here address certain shortcomings but not necessarily each and every one described here or known in the art.

SUMMARY

A comparator tracking scheme for an analog-to-digital converter (ADC) may implement a dynamic window size by varying over time a number of comparators powered up to convert an analog input signal to a digital output signal. Varying the number of activated comparators may allow the ADC to increase the number of comparators when the analog input signal is rapidly changing to increase the accuracy of the digital output signal of the ADC. Varying the number of comparators powered up may also allow the ADC to decrease the number of comparators when the analog input signal is relatively constant to decrease power consumption of the ADC by reducing the number of powered up components. This dynamic window size may allow the ADC to improve the trade-off between power consumption and ability to capture rapidly changing signals in the analog input signal.

A comparator-tracking scheme may be implemented, for example, in a controller coupled to a plurality of comparators in an analog-to-digital converter (ADC). For example, the controller may determine a window size for the ADC and determine a window position for the ADC. The controller may then activate comparators of the ADC within a window centered at the window position and having a width of the window size. In one embodiment, the controller may determine a window size by analyzing an output of a filter, such as a band-pass filter (BPF) or a high-pass filter (HPF), coupled to either the analog input signal or the digital output signal. When the filter output indicates a rapidly changing analog input signal, the controller may dynamically increase a window size of the ADC, which may increase a number of comparators powered on. The controller may reevaluate the filter output and update the window size and/or window position at a later time. In one embodiment, the controller may continuously update the window size and/or window position.

According to one embodiment, an apparatus may include an analog input node configured to receive an analog signal; a plurality of comparators coupled to the analog input node and configured to convert the analog signal to a digital signal; and/or a controller coupled to the plurality of comparators. The controller may be configured to determine a window size for converting the analog signal; determine a window position for converting the analog signal; turn on comparators of the plurality of comparators within a window defined by the determined window size and the determined window position; and/or update the window size for converting the analog signal.

In certain embodiments, the controller may also be configured to update the window size for converting the analog signal based, at least in part, on a frequency input content of the digital signal; the controller may also be configured to increase the window size when the frequency detection block output is above a first threshold; the controller may also be configured to decrease the window size when the frequency detection block output is below a second threshold; the controller may also be configured to increase the window size when the frequency detection block detects a high magnitude of changes; the controller may also be configured to decrease the window size when the frequency detection block detects a low magnitude of changes; and/or the controller may also be configured to update the window position from a previous window position to a new window position by calculating a correction value based, at least in part, on the frequency detection block output and adding the correction value to the previous window position to obtain the new window position.

In some embodiments, the apparatus may also include a frequency detection block coupled to or integrated with the controller and configured to receive the digital signal, wherein the controller is configured to update the window size based, at least in part, on an output of the frequency detection block, wherein the frequency detection block may include a high-pass filter (HPF), wherein the high-pass filter has a transfer function of approximately $1-z^{-1}$, and/or wherein the frequency detection block may include a band-pass filter (BPF).

According to another embodiment, a method may include converting an analog signal to a digital signal with a plurality of comparators, wherein a first portion of the plurality of comparators are activated and a second portion of the plurality of comparators are not activated, and wherein the first portion of comparators is defined by a window size and a window position; determining the window size for the first portion of comparators based, at least in part, on the digital signal, wherein the window size determines a quantity of the plurality of comparators in the first portion; determining the window position for the first portion of comparators based, at least in part, on the digital signal, wherein the window position determines which of the plurality of comparators are in the first portion; and/or updating the window size for the first portion of comparators.

In certain embodiments, the step of updating the window size may include updating the window size based, at least in part, on a frequency input content of the digital signal; the step of adjusting the window size may include decreasing the window size when a low magnitude of changes is detected in the digital signal and increasing the window size when a high magnitude of changes is detected in the digital signal; the step of detecting the magnitude of changes may include performing high-pass filtering on the digital signal; the step of adjusting the window size may include increasing the window size when an output of the high-pass filtering is above a first threshold and decreasing the window size when the output of the high-pass filtering is below a second threshold; and/or the step of detecting the magnitude of changes may include performing band-pass filtering on the digital signal.

In some embodiments, the method may also include detecting a magnitude of changes in the digital signal; adjusting the window size based on the magnitude of changes in the digital signal; and/or adjusting the window position from a previous window position to a new window position by calculating a correction value based, at least in part, on the detected frequency changes in the digital signal and adding the correction value to the previous window position to obtain the new window position.

According to a further embodiment, an apparatus may include a plurality of comparators configured to convert an analog signal to a digital signal; a processing block coupled to receive the digital signal and configured to determine a frequency input content of the digital signal; and/or a controller coupled to the processing block and coupled to the plurality of comparators. The controller may be configured to determine a window size for converting the analog signal based, at least in part, on the frequency input content of the digital signal; determine a window position for converting the analog signal; turn on comparators of the plurality of comparators within a window defined by the determined window size and the determined window position; and/or update the window size for converting the analog signal based, at least in part, on the frequency input content of the digital signal.

In certain embodiments, the processing block may include a frequency detection block; the processing block may include a high-pass filter (HPF) wherein the controller is configured to increase the window size when the high-pass filter (HPF) output is above a first threshold and decrease the window size when the high-pass filter (HPF) output is below a second threshold; and/or the controller may include a digital output tracking and prediction block configured to determine a portion of the plurality of comparators to activate and an analog-to-digital converter (ADC) control sequence block configured to generate a control sequence to activate the portion of the plurality of comparators.

In some embodiments, the apparatus may also include a sparkle code correction block coupled to the digital signal output by the plurality of comparators; and/or a thermocode decode block coupled to the sparkle code correction.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 1:
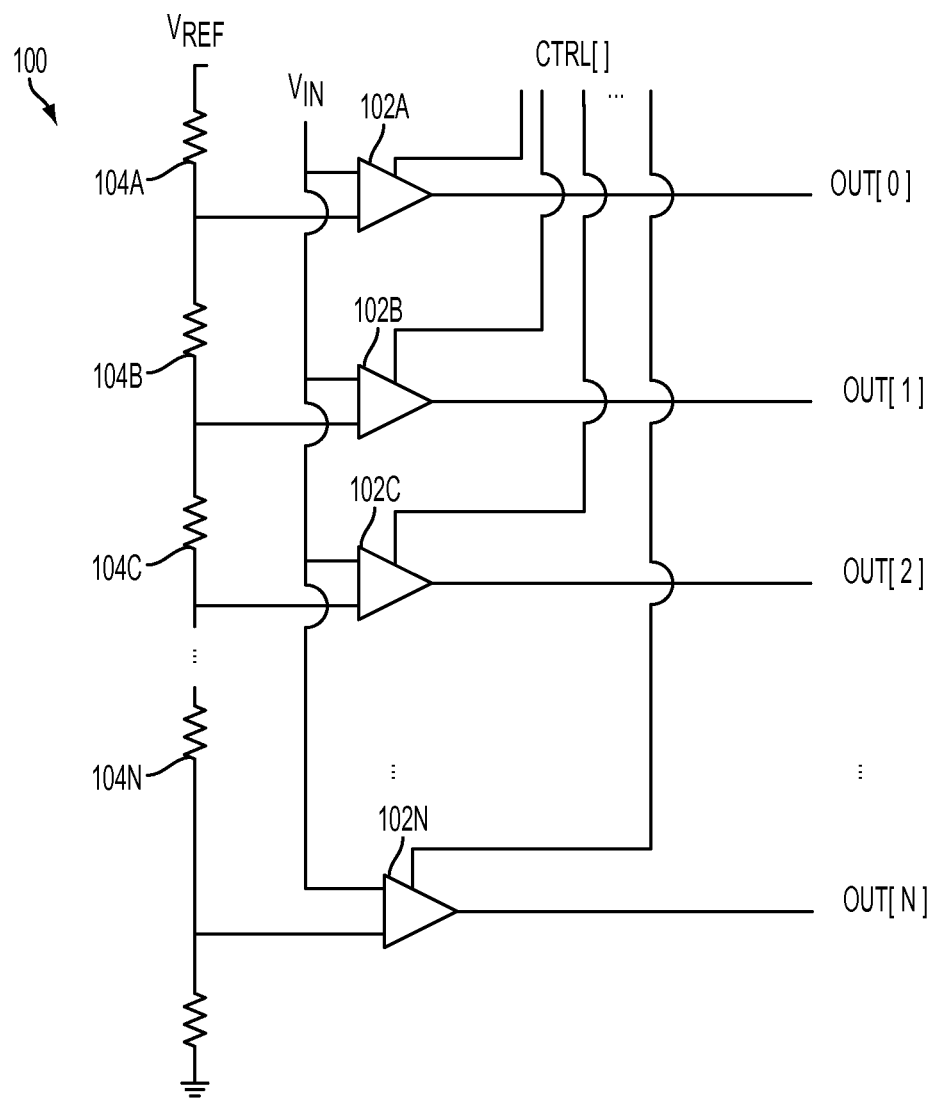
FIG. 1 is a schematic of a conventional analog-to-digital converter (ADC).
Figure 2A:
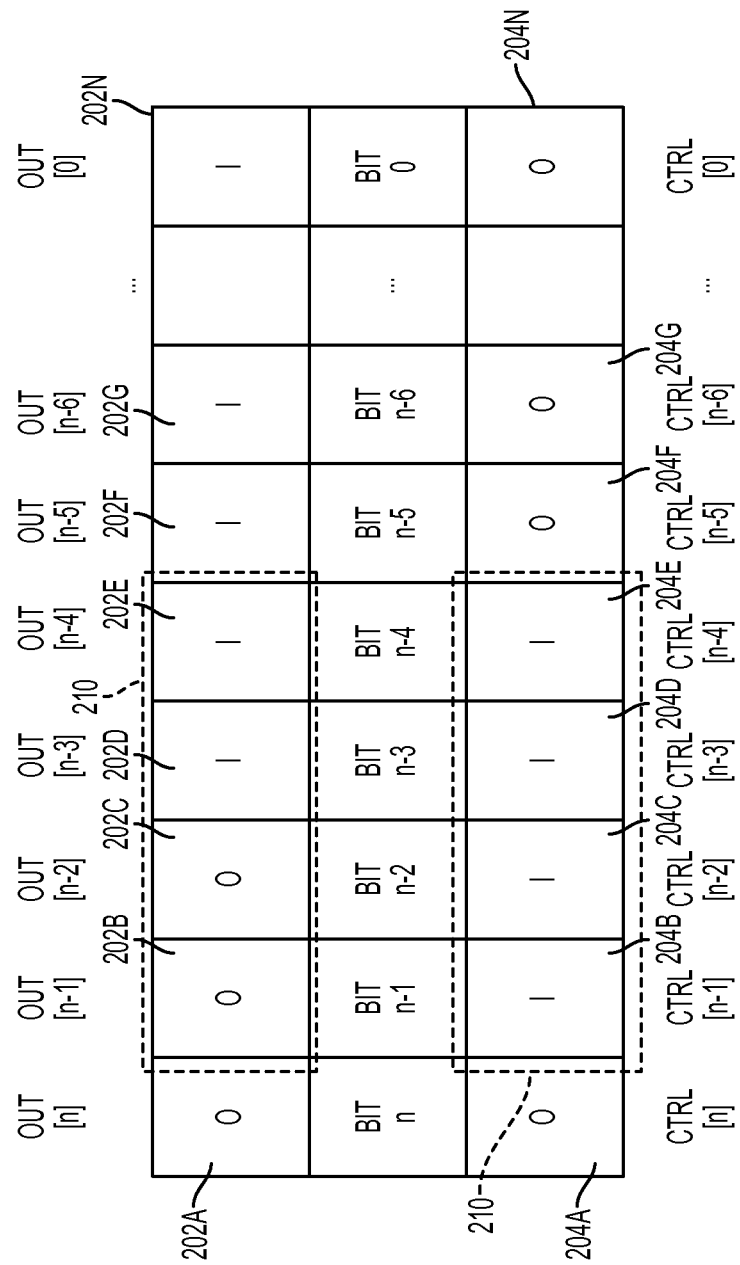
FIG. 2A is a block diagram illustrating a control scheme for comparators of an analog-to-digital converter (ADC) having a first window size according to one embodiment of the disclosure.
Figure 2B:
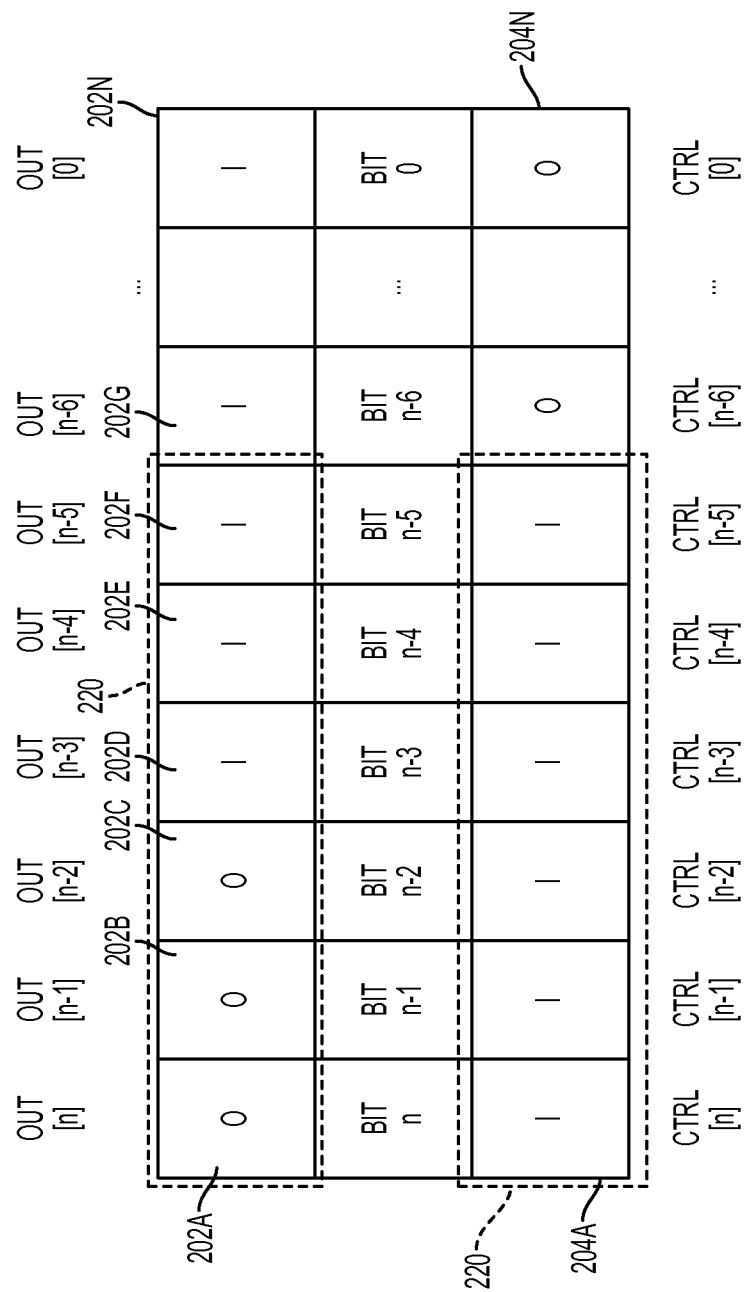
FIG. 2B is a block diagram illustrating a control scheme for comparators of an analog-to-digital converter (ADC) having a second window size according to one embodiment of the disclosure.

A dynamic window size for an analog-to-digital converter (ADC) is shown conceptually in FIGS. 2A-2B. FIG. 2A is a block diagram illustrating a control scheme for comparators of an analog-to-digital converter (ADC) having a first window size according to one embodiment of the disclosure. A plurality of comparators may each output one bit in a digital output signal, OUT. That is, bits 202A-N may each correspond to the output of one comparator of an ADC. A control signal, CTRL, having a number of bits may be provided to the plurality of comparators. A comparator may activate when a bit of the control bits 204A-N corresponding to the comparator is '1.' For example, control bits 204B-E as shown in FIG. 2A are '1' bits, and thus comparators corresponding to output bits 202B-E are activated. Although '1' and '0' bits are shown in the control bits 204A-N, the values may be inverted such that a '0' bit activates the corresponding comparator. The '1' control bits 204B-204E may define a window 210 of active comparators. That is, the comparators corresponding to the output bits 202B-E within the window 210 are active and powered on.

The control bits 204A-N may be generated by a controller coupled to the comparators and the ADC. The controller may adjust the size of the window 210 by, for example, changing the control bits 204A-N. FIG. 2B is a block diagram illustrating a control scheme for comparators of an analog-to-digital converter (ADC) having a second window size according to one embodiment of the disclosure. Control bits 204A-F are set as '1' bits by the controller to define an updated window 220. The window 220 is two bits larger than the window 210. Thus, two additional comparators may be activated by the control signal, CTRL. Although the window 220 is shown centered at the same position as the window 210, the position of the window 220 may also be changed during an update. For example, the window 220 may be shifted from control bits 204A-F to control bits 204B-G. When the position of the window 220 is controlled along with the size of the window 220, the size and position may be independently controlled.

Figure 3:
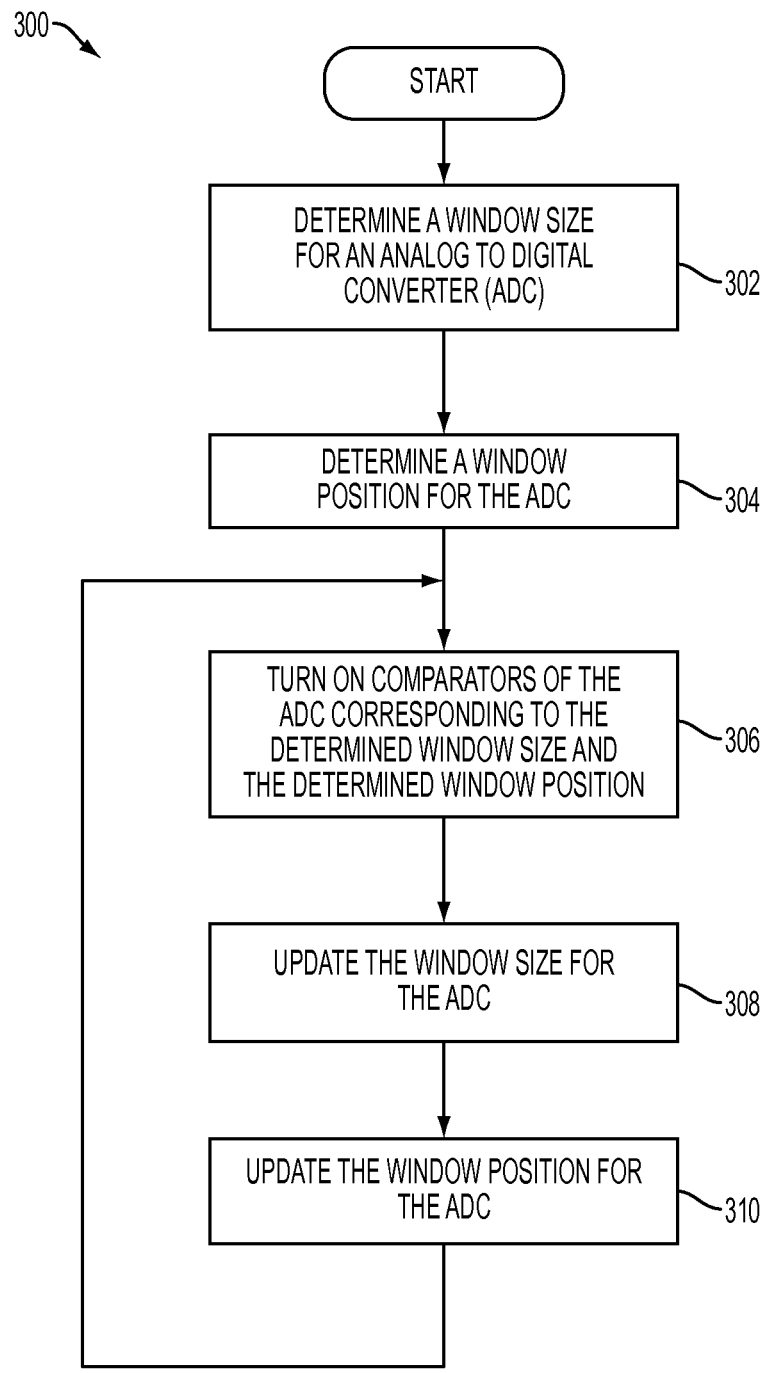
FIG. 3 is a flow chart illustrating a method of dynamically controlling a window size of an analog-to-digital converter (ADC) according to one embodiment of the disclosure.

A dynamic window size may be implemented in an analog-to-digital converter (ADC) according to a method shown in FIG. 3. FIG. 3 is a flow chart illustrating a method of dynamically controlling a window size of an analog-to-digital converter (ADC) according to one embodiment of the disclosure. A method 300 begins at block 302 with determining a window size for an analog-to-digital converter (ADC). Then, at block 304 a window position is determined for the ADC. The determined window size and position may define a window of active comparators, such as the windows 210 and 220 of FIGS. 2A-B. At block 306, comparators of the ADC may be activated corresponding to the determined window size of block 302 and the determined window position of block 304. The comparators may be activated by a control signal generated by the controller, such as the control bits 204A-N of FIGS. 2A-B. At a later time, the determined window size of block 302 may be updated at block 308 and the determined window position of block 304 may be updated at block 310. The method 300 of FIG. 3 may be executed, for example, within a controller coupled to the ADC.

Figure 4:
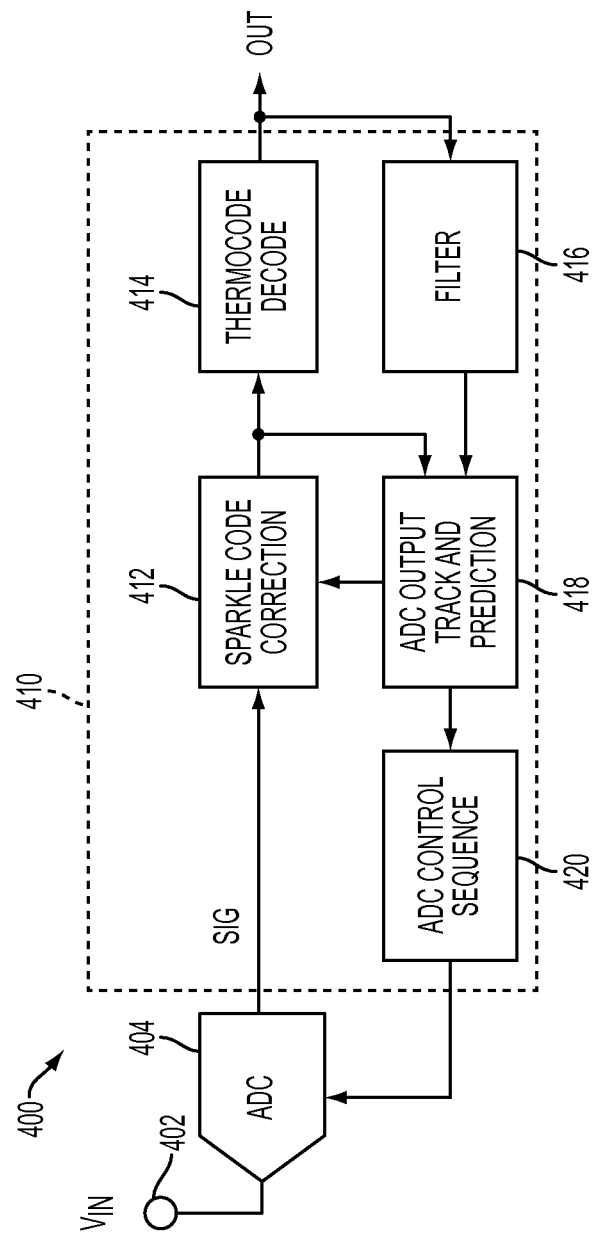
FIG. 4 is a block diagram illustrating a controller with dynamic window size control of an analog-to-digital converter (ADC) according to one embodiment of the disclosure.

One example of a controller for controlling an analog-to-digital converter (ADC) is shown in FIG. 4. FIG. 4 is a block diagram illustrating a controller with dynamic window size control of an analog-to-digital converter (ADC) according to one embodiment of the disclosure. A system 400 may include a controller 410 coupled to an ADC 404. The ADC 404 may include a plurality of comparators, which the controller 410 may instruct to activate (e.g., power on) or deactivate (e.g., power off). The ADC 404 may be coupled to an analog input node 402 to receive an analog input signal, $V_{in}$. The ADC 404 may output a digital signal, sig, that may be further processed by the controller 410 to generate a digital output signal, OUT. For example, the controller 410 may include a sparkle code correction block 412, which may correct bubble error, and a thermocode decode block 414, which may translate a thermometer code to a two's complement code, to process the digital signal, sig, and generate the digital output signal, OUT. Although blocks of the controller 410 are shown as separate components of the controller 410, the blocks may be implemented in one or more controllers as part of one or more integrated circuits (ICs). The controllers or ICs may, for example, be integrated into electronic devices, such as mobile devices including cellular telephones and mobile audio players.

The controller 410 may also include a filter 416 coupled to the digital output signal, OUT. The filter 416 may be, for example, a band-pass filter (BPF) or a high-pass filter (HPF). In one embodiment when the filter 416 is a HPF, the filter 416 may have a transfer function of $1-z^{-1}$ and an update rate of approximately 0.5 MHz to 3 MHz. An output of the filter 416 may be provided to an ADC output tracking and prediction block 418. The ADC output tracking and prediction block 418 may include a frequency detection block containing, for example, a logic circuit to process the output of the filter 416 and determine a frequency of changes within the analog input signal, $V_{in}$. The ADC output tracking and prediction block 418 may also include logic circuitry for determining a window size and a window position based on information from the filter 416 and current and previous outputs from the ADC 404. For example, the block 418 may receive data from the filter 416 and the sparkle code correction block 412 and generate a prediction of a future value of the analog input signal, $V_{in}$, and determine an appropriate window size and window position for the predicted future value of the analog input signal, $V_{in}$. The determined window size and window position may be output from the block 418 to an ADC control sequence block 420, which may convert the determined window size and window position into a control signal provided to the ADC 404. The output control signal from the ADC control sequence block 420 may be, for example, the control bits 204A-N described above with reference to FIGS. 2A-B.

Figure 5:
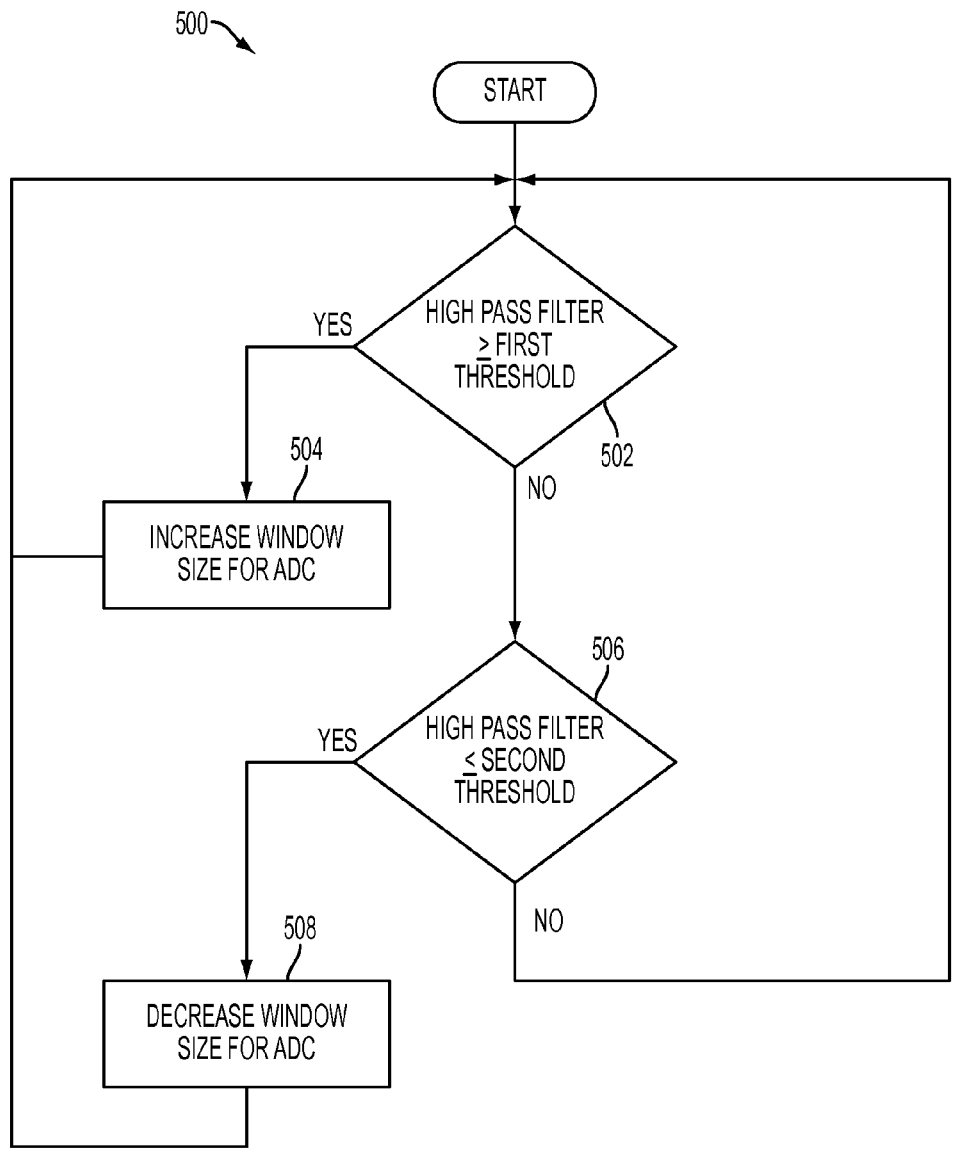
FIG. 5 is a flow chart illustrating a method of adjusting a window size of an analog-to-digital converter (ADC) based on an output of a high-pass filter (HPF) according to one embodiment of the disclosure.

When the filter 416 is a high-pass filter (HPF), the high-pass filter may determine a magnitude of changes at the output digital signal, OUT, which are indicative of a magnitude of changes at the input analog signal, $V_{in}$. Thresholds may be set within the ADC output tracking and prediction block 418 to dynamically adjust a window size of the ADC 404 based on an output of the high-pass filter (HPF). FIG. 5 is a flow chart illustrating a method of adjusting a window size of an analog-to-digital converter (ADC) based on an output of a high-pass filter (HPF) according to one embodiment of the disclosure. A method 500 may begin at block 502 with determining if a high-pass filter output is higher than a first threshold. If the first threshold is exceeded, then the method 500 may proceed to block 504 to increase a window size for the ADC 404. When the high-pass filter output is high, the analog input signal, $V_{in}$, may be rapidly changing. Thus, block 504 may correspond to increasing the window size when the frequency detection block of the ADC output tracking and prediction block 418 detects a high magnitude of changes.

If the first threshold is not exceeded at block 502, then the method 500 continues to block 506 to determine if an output of the high-pass filter (HPF) is below a second threshold. When the output is below the second threshold, the method 500 may proceed to block 508 to decrease a window size for the ADC 404. When the high-pass filter (HPF) output is below the second threshold, the analog input signal, $V_{in}$, may be considered to be relatively constant. Thus, block 508 may correspond to decreasing the window size when the frequency detection block detects a low magnitude of changes. Decreasing the window size may decrease the number of active comparators, and thus may decrease power consumption within the ADC 404. Reduced power consumption may be advantageous in small devices where little space for heat dissipation is available. Reduced power consumption may also be advantageous in portable devices to extend battery life. After increasing or decreasing the window size at blocks 504 and 508, respectively, the method 500 may return to block 502 to continue to update the window size. If no change is made in the window size at block 506, the method 500 may return to testing the output of the high pass filter (HPF) at block 502.

Figure 6:
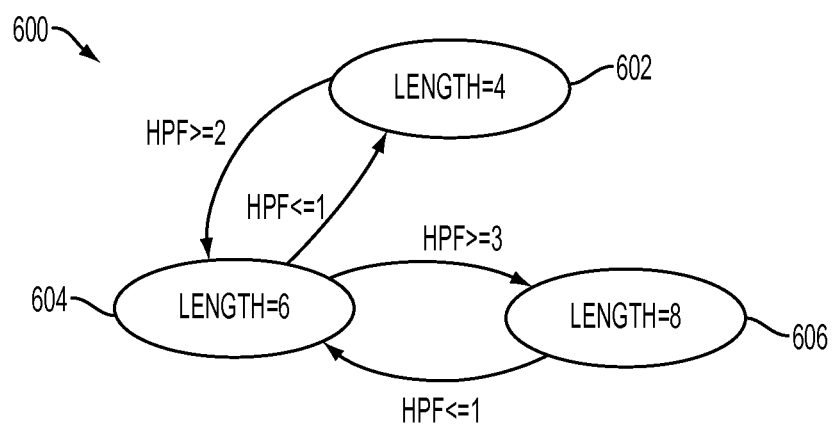
FIG. 6 is a block diagram illustrating a state machine for a dynamic window size in an analog-to-digital converter (ADC) according to one embodiment of the disclosure.

The increasing and decreasing of the window size at blocks 504 and 508 may be implemented in a state machine. In the state machine, the first threshold and the second threshold for increasing or decreasing the window size, respectively, may be adjusted based on a current state of the state machine. FIG. 6 is a block diagram illustrating a state machine for a dynamic window size in an analog-to-digital converter (ADC) according to one embodiment of the disclosure. A state machine 600 may include, for example, state 602 corresponding to a window size of four comparators, state 604 corresponding to a window size of six comparators, and state 606 corresponding to a window size of eight comparators. Although only three example states 602, 604, and 606 are shown, additional larger or small window sizes may be included in the state machine 600. Additionally, increments of window size of sizes other than two are also possible within the state machine 600. The state machine 600 may be updated, that is to determine whether to transition between states 602, 604, and 606, once per clock cycle. In one embodiment described above, the clock cycle may be approximately 0.5 MHz to 3 MHz.

The state machine 600 may begin, for example, in state 602 with a window size of four. When the output of a high-pass filter (HPF) is greater than two, the state machine 600 may transition to state 604 with a window size of six. The high-pass filter (HPF) may produce a number of different outputs used to determine the content of the data. In one embodiment, the high-pass filter (HPF) output may be a discrete value indicating a relative magnitude of a change of the signal. For example, the value '2' corresponding to transition between the state 602 and 604 may indicate a certain magnitude of change in the signal passing through the high-pass filter (HPF). At state 604, the first threshold may be set to three and the second threshold may be set to one. When the output of the high-pass filter (HPF) is greater than or equal to three, the state machine 600 may transition to a state 606 with a window size of eight. When the output of the high-pass filter (HPF) is less than or equal to one, the state machine 600 may return to state 602 with a window size of four. A generic state machine, similar to that of state machine 600, may be formulated from an equation for window size:

$$W(n) = W(n-1) + \Delta, \Delta = \begin{cases} 2, & \text{if high-pass filter output} \geq \text{Threshold}_1 \\ 0, & \text{if high-pass filter output} < \text{Threshold}_2 \\ -2, & \text{if high-pass filter output} < \text{Threshold}_3 \end{cases}$$

where W(n) is a current window size, W(n−1) is a previous window size, and Threshold$_1$, Threshold$_2$, and Threshold$_3$ are thresholds for changing the dynamic window size. The threshold values may change as the window size changes. For example, in state 602, Threshold$_1$ may be 2 and Threshold$_3$ may be 1, and in state 604, Threshold$_1$ may be 3 and Threshold$_3$ may be 1.

Figure 7:
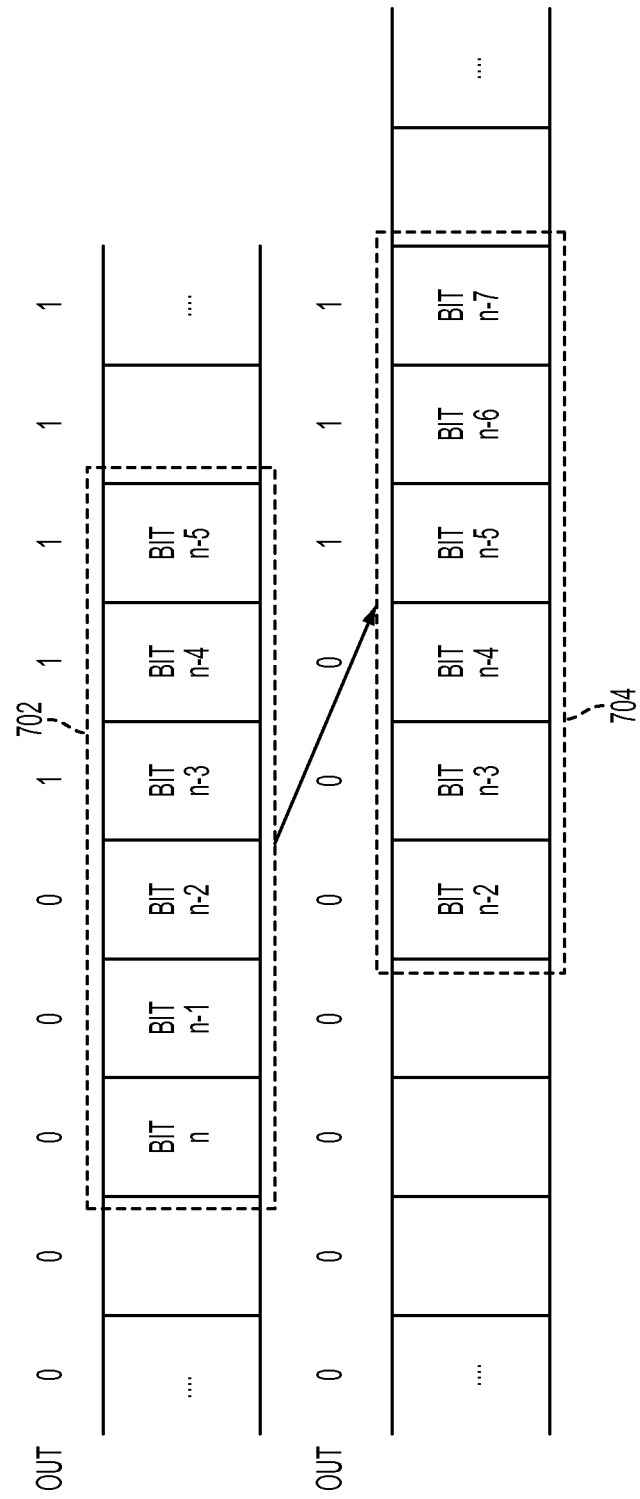
FIG. 7 is a block diagram illustrating a change in window position according to one embodiment of the disclosure.

As described above, a window size may be dynamically adjusted. A window position may also be dynamically adjusted independently of the window size. A change in window position is shown conceptually in FIG. 7. FIG. 7 is a block diagram illustrating a change in window position according to one embodiment of the disclosure. A window 702 may initially be positioned around bits n, n−1, n−2, n−3, n−4, and n−5. The corresponding output bits of digital output signal, OUT, may be 0, 0, 0, 1, 1, and 1, respectively. In one embodiment, the window position may be selected to position a transition from 0's to 1's of the digital output signal, OUT, at a center of the window 702. In other embodiments, the window position may be selected to position a transition from 0's to 1's to provide additional headroom in the direction a signal is changing. For example, when the transition from 0's to 1's is expected to move toward less significant bits (LSBs, e.g., right in the bits of FIG. 7), the window position may be selected to place the transition from 0's to 1's toward more significant bits (MSBs, e.g., left in the bits of FIG. 7). A new window position may be determined and the window 702 shifted to a window 704 including bits n−2, n−3, n−4, n−5, n−6, and n−7. As shown in FIG. 7, the window size of windows 702 and 704 are identical. However, a change in window size may also occur when the window position changes.

Figure 8:
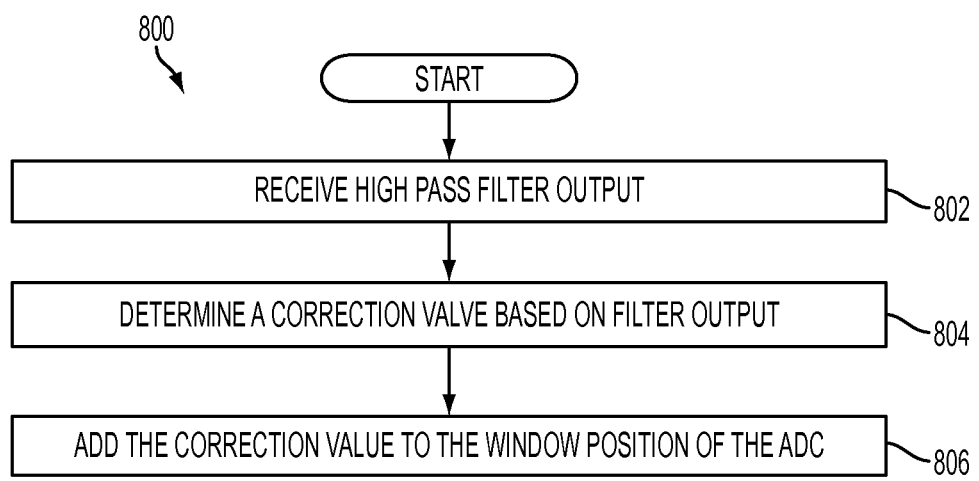
FIG. 8 is a flow chart illustrating a method for adjusting a window position according to one embodiment of the disclosure.

Window position control may be programmed into the controller 410 of FIG. 4. One method for adjusting a window position by the controller is shown in FIG. 8. FIG. 8 is a flow chart illustrating a method for adjusting a window position according to one embodiment of the disclosure. A method 800 may start at block 802 with receiving a high-pass filter (HPF) output. At block 804, a correction value may be determined based on the received HPF output at block 802. The correction value may be, for example, a delta difference value indicating an amount and direction to shift the window position. Then, at block 806, the correction value may be added to a current window position of the analog-to-digital converter (ADC). In one example, a new window position may be calculated according to:

Position($k$)=Position($k$−1)+Δ, where Δ is the correction value, Position(k−1) is a previous window position, and Position(k) is a new window position.

If implemented in firmware and/or software, the functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. For example, although activation of comparators in an analog-to-digital converter (ADC) is described above, other components may be controlled with the controller described above and/or comparators for purposes other than analog-to-digital conversion may be controlled with the controller described above. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
   an analog input node configured to receive an analog signal;
   a plurality of comparators coupled to the analog input node and configured to convert the analog signal to a digital signal;
   a frequency detection block configured to receive the digital signal and analyze a frequency content of the digital signal; and
   a controller coupled to the plurality of comparators and to the frequency detection block, wherein the controller is configured to:
      dynamically determine a window size for converting the analog signal based, at least in part, on an output of the frequency detection block, wherein determining the window size comprises:
         increasing the window size when the frequency detection block detects a high magnitude of changes; and
         decreasing the window size when the frequency detection block detects a low magnitude of changes;
      determine a window position for converting the analog signal; and
      turn on comparators of the plurality of comparators within a window defined by the determined window size and the determined window position.

2. The apparatus of claim 1, wherein the controller is further configured to update the window size for converting the analog signal by dynamically determining a second window size for converting the analog signal.

3. The apparatus of claim 1, wherein the frequency detection block comprises a high-pass filter (HPF).

4. The apparatus of claim 3, wherein the high-pass filter (HPF) has a transfer function of approximately $1-z^{-1}$.

5. The apparatus of claim 1, wherein the frequency detection block comprises a band-pass filter (BPF).

6. The apparatus of claim 1, wherein the controller is further configured to:
   increase the window size when the frequency detection block output is above a first threshold; and
   decrease the window size when the frequency detection block output is below a second threshold.

7. The apparatus of claim 1, wherein the controller is configured to increase the window size by turning on additional comparators of the plurality of comparators, and wherein the controller is configured to decrease the window size by turning off comparators of the plurality of comparators.

8. The apparatus of claim 1, wherein the controller is further configured to dynamically determine the window position from a previous window position to a new window position by:
   calculating a correction value based, at least in part, on the frequency detection block output; and
   adding the correction value to the previous window position to obtain the new window position.

9. A method, comprising:
   converting an analog signal to a digital signal with a plurality of comparators, wherein a first portion of the plurality of comparators are activated and a second portion of the plurality of comparators are not activated, and wherein the first portion of comparators is defined by a window size and a window position;
   dynamically determining the window size for the first portion of comparators based, at least in part, on the digital signal, wherein the window size determines a quantity of the plurality of comparators in the first portion, wherein the step of dynamically determining the window size comprises:
      detecting a magnitude of changes in the digital signal; and
      adjusting the window size based on the magnitude of changes in the digital signal by:
         decreasing the window size when a low magnitude of changes is detected in the digital signal; and
         increasing the window size when a high magnitude of changes is detected in the digital signal; and
   determining the window position for the first portion of comparators based, at least in part, on the digital signal, wherein the window position determines which of the plurality of comparators are in the first portion.

10. The method of claim 9, further comprising updating the window size for the first portion of comparators by dynamically determining a second window size.

11. The method of claim 9, wherein the step of updating the window size comprises dynamically determining the window size based, at least in part, on a frequency input content of the digital signal.

12. The method of claim 9, wherein the step of decreasing the window size comprises turning off comparators of the plurality of comparators, and wherein the step of increasing the window size comprises turning on comparators of the plurality of comparators.

13. The method of claim 9, wherein the step of detecting the magnitude of changes comprises performing high-pass filtering on the digital signal.

14. The method of claim 13, wherein the step of adjusting the window size comprises:
    increasing the window size when an output of the high-pass filtering is above a first threshold; and
    decreasing the window size when the output of the high-pass filtering is below a second threshold.

15. The method of claim 9, wherein the step of detecting the magnitude of changes comprises performing band-pass filtering on the digital signal.

16. The method of claim 9, further comprising adjusting the window position from a previous window position to a new window position by:
    calculating a correction value based, at least in part, on the detected frequency changes in the digital signal; and
    adding the correction value to the previous window position to obtain the new window position.

17. An apparatus, comprising:
    a plurality of comparators configured to convert an analog signal to a digital signal;
    a processing block configured to receive the digital signal and configured to determine a frequency input content of the digital signal, wherein the processing block comprises a frequency detection block; and
    a controller coupled to the processing block and coupled to the plurality of comparators, wherein the controller is configured to:
        dynamically determine a window size for converting the analog signal based, at least in part, on an indication of the frequency input content of the digital signal received from the processing block, wherein determining the window size comprises:
            increasing the window size when the processing block detects a high magnitude of changes; and
            decreasing the window size when the processing block detects a low magnitude of changes;
        determine a window position for converting the analog signal; and
        turn on comparators of the plurality of comparators within a window defined by the determined window size and the determined window position.

18. The apparatus of claim 17, further comprising:
    a sparkle code correction block coupled to the digital signal output by the plurality of comparators; and
    a thermocode decode block coupled to the sparkle code correction.

19. The apparatus of claim 17, wherein the processing block comprises a high-pass filter (HPF), and wherein the controller is configured to:
    increase the window size when the high-pass filter (HPF) output is above a first threshold; and
    decrease the window size when the high-pass filter (HPF) output is below a second threshold.

20. The apparatus of claim 19, wherein the controller is configured to increase the window size by turning on comparators of the plurality of comparators, and wherein the controller is configured to decrease the window size by turning off comparators of the plurality of comparators.

21. The apparatus of claim 17, wherein the controller comprises:
    a digital output tracking and prediction block configured to determine a portion of the plurality of comparators to activate; and
    an analog-to-digital converter (ADC) control sequence block configured to generate a control sequence to activate the portion of the plurality of comparators.

* * * * *